United States Patent
Okamoto

(10) Patent No.: US 6,650,579 B1
(45) Date of Patent: Nov. 18, 2003

(54) SEMICONDUCTOR DEVICE HAVING TEST AND READ MODES AND PROTECTION SUCH THAT ROM DATA READING IS PREVENTED IN THE TEST MODE

(75) Inventor: Hiroaki Okamoto, Tokyo (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/377,625

(22) Filed: Aug. 23, 1999

(30) Foreign Application Priority Data

Aug. 25, 1998  (JP) .......................................... 10-239016

(51) Int. Cl.7 ................................................ G11C 7/00
(52) U.S. Cl. .................... 365/201; 365/94; 365/189.01; 365/189.12
(58) Field of Search ...................... 365/201, 94, 189.04, 365/189.01, 189.12, 189.05

(56) References Cited

U.S. PATENT DOCUMENTS

| 5,164,918 A | * | 11/1992 | Ogino et al. ................. 365/201 |
| 5,345,413 A | * | 9/1994 | Fisher et al. ............ 365/189.07 |
| 5,386,385 A | * | 1/1995 | Stephens, Jr. ................ 365/201 |
| 5,526,311 A | * | 6/1996 | Kreifels et al. ......... 365/189.01 |
| 5,959,912 A | * | 9/1999 | Powell et al. ................ 365/201 |
| 6,085,346 A | * | 7/2000 | Lepejian et al. ............. 714/733 |
| 6,108,793 A | * | 8/2000 | Fujii et al. ................... 713/400 |

FOREIGN PATENT DOCUMENTS

JP  5-265867  10/1993

* cited by examiner

Primary Examiner—Richard Elms
Assistant Examiner—Toan Le
(74) Attorney, Agent, or Firm—Arent Fox Kintner Plotkin & Kahn

(57) ABSTRACT

A semiconductor device having a test mode and a read mode is provided. This semiconductor device includes a ROM and a control circuit. When a predetermined condition is satisfied, the control circuit prevents data stored in the ROM from being outputted to the outside of the semiconductor device in the test mode.

19 Claims, 7 Drawing Sheets

F I G. 4

| MODE \ TERMINAL | 71 | 72 | 73 | 74 | 75 |
|---|---|---|---|---|---|
| DISABLED | 0 | 0 | 0 | 0 | 0 |
| In-ROM | 0 | 1 | 0 | 0 | 1 |
| EVA | 1 | 0 | 0 | 1 | 0 |
| EPROM | 1 | 1 | 1 | 0 | 0 |

SEMICONDUCTOR DEVICE HAVING TEST AND READ MODES AND PROTECTION SUCH THAT ROM DATA READING IS PREVENTED IN THE TEST MODE

BACKGROUND OF THE INVENTION

1. Field of the Invention

The present invention generally relates to semiconductor devices, and more particularly, to a semiconductor device which has a central processing unit (CPU) and peripheral circuits on the same chip, and operates in an EPROM (Erasable and Programmable ROM)/ICE (In-Circuit Emulator) mode. The EPROM/ICE mode is a test mode for evaluating the characteristics and checking operations of the semiconductor chip. In the ROM mode, the semiconductor device operates in accordance with the data stored in an internal ROM.

2. Description of the Related Art

In recent years, in response to increasing demands for smaller and lighter electronic equipment for household appliances, more and more semiconductor devices having high precision analog circuits on one chip are employed in electronic equipment. In the case where a digital circuit and an analog circuit are mounted on the same chip, it is difficult to produce a developmental semiconductor device having an EPROM/ICE circuit, and a mass-production type semiconductor device having a ROM, and to make both semiconductor devices have the same characteristics.

Conventionally, the developmental semiconductor device having the EPROM/ICE mode circuit for characteristic evaluation and operation check has been produced separately from the mass-production type semiconductor device having the ROM. The two semiconductor devices of different types have been developed so that the characteristics of the semiconductor devices are the same. The developmental semiconductor device having the EPROM/ICE mode circuit has been used, instead of the mass-production type semiconductor device, for evaluating characteristics, checking operations, and debugging in software development.

In the case where a digital circuit and a high precision analog circuit are mounted on the same chip, however, it is difficult to produce the developmental semiconductor device having the EPROM/ICE mode circuit and the mass-production type semiconductor device having the ROM so that the two semiconductor devices of different types have the same characteristics. More specifically, in semiconductor devices of the two types used in a battery-powered electronic device, such as camera or portable telephone, the power consumption and noise characteristics of both semiconductor devices are required to be the same. It is even more difficult to produce such two semiconductor devices separately. Also, producing the two semiconductor devices separately causes problems that the manufacturing period of the semiconductor devices are prolonged, and that the production costs of the semiconductor devices become higher.

Furthermore, in a conventional semiconductor device having the EPROM/ICE mode circuit and the ROM on the same chip, data stored in the ROM can be easily read in the EPROM/ICE mode. Therefore, there is always the danger that other people might obtain the ROM data against the owner's will.

SUMMARY OF THE INVENTION

A general object of the present invention is to provide a semiconductor device in which the above disadvantages are eliminated.

A more specific object of the present invention is to provide a semiconductor device which operates in a test mode and a read mode, and is protected so that ROM data is not read in the test mode.

The above objects of the present invention are achieved by a semiconductor device having a test mode and a read mode. This semiconductor device includes a ROM and a control circuit which prevents data stored in the ROM from being outputted to the outside of the semiconductor device in the test mode when a predetermined condition is satisfied.

The above objects of the present invention are also achieved by a semiconductor device which includes: a mode switch circuit which selects between a test mode and a ROM mode in accordance with mode select signals from the outside; a ROM read control circuit which outputs a first signal to enable ROM data reading; and a register which transmits a second signal to the ROM read control circuit so that the ROM read control circuit outputs the first signal.

Since the semiconductor device operates in both the test mode and the ROM mode, there is no need to produce two types of semiconductor device corresponding to the two modes. Thus, the manufacturing period of the semiconductor device can be shortened, and the production costs can be reduced. When the semiconductor device is in the test mode, the ROM data cannot be read out unless a predetermined condition is satisfied. Thus, reading the ROM data against the owner's will can be avoided in the test mode.

The above and other objects and features of the present invention will become more apparent from the following description taken in conjunction with the accompanying drawings.

BRIEF DESCRIPTION OF THE DRAWINGS

FIG. 4 shows the relationship between signals inputted into the mode switch circuit and signals outputted from the mode switch circuit;

DESCRIPTION OF THE PREFERRED EMBODIMENTS

The following is a description of embodiments of the present invention, with reference to the accompanying drawings.

Figure 1:
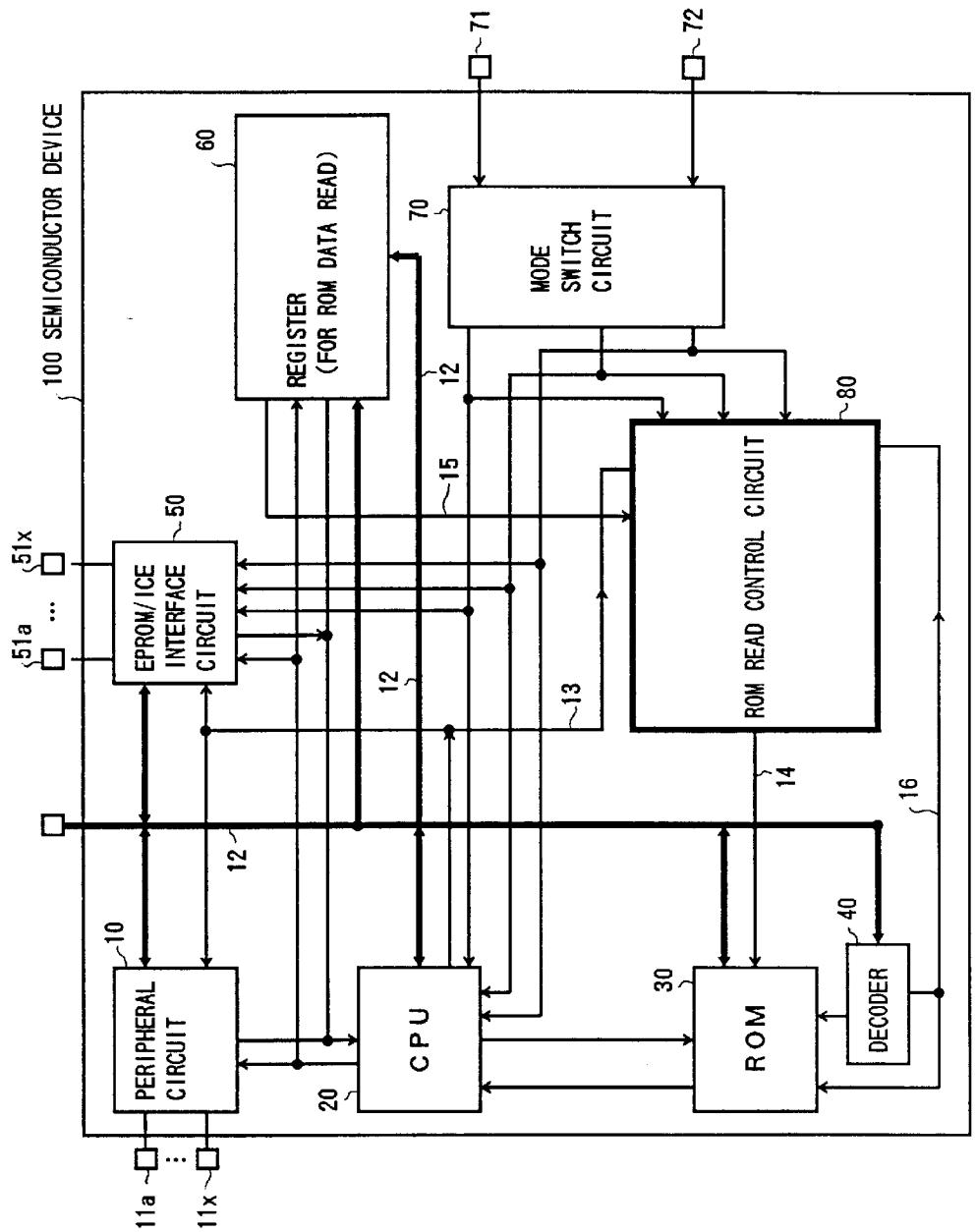
FIG. 1 is a schematic view of a semiconductor device of the present invention.

As shown in FIG. 1, a semiconductor device 100 comprises a peripheral circuit 10, a CPU 20, a ROM 30, a decoder 40, an EPROM/ICE interface circuit 50, a register 60, a mode switch circuit 70, and a ROM read control circuit 80. These circuits are connected by internal buses 12 and signal lines 13 to 16. Signals passing through the signal lines will be hereinafter denoted by the same reference numerals as the corresponding signal lines.

The peripheral circuit 10 comprises a register, a RAM (not shown), and other circuit. These circuits in the peripheral circuit 10 transmit and receive signals via terminal 11a to 11x. The EPROM/ICE interface circuit 50 is an interface circuit for controlling the semiconductor device 100 in an EPROM/ICE mode by an external ICE tool or EPROM (not shown). The EPROM/ICE interface circuit 50 has terminals 51a to 51x. In an ICE mode, the ICE tool is connected to the terminals 51a to 51x, so that the operation of the semiconductor device 100 can be controlled by a personal computer or a special device for the semiconductor device 100. In an EPROM mode, the EPROM is connected to the terminals 51a to 51x, so that the semiconductor device 100 operates in accordance with instructions written in the EPROM.

The register 60 is a register, and determines whether data should be read from the ROM 30 in the EPROM/ICE mode. The register 60 receives the data via an internal bus 12. If the register 60 receives a certain data value in the EPROM/ICE mode, the register 60 outputs a high-level signal 15 to the ROM read control circuit 80, so that the data can be read from the ROM 30.

Figure 2:
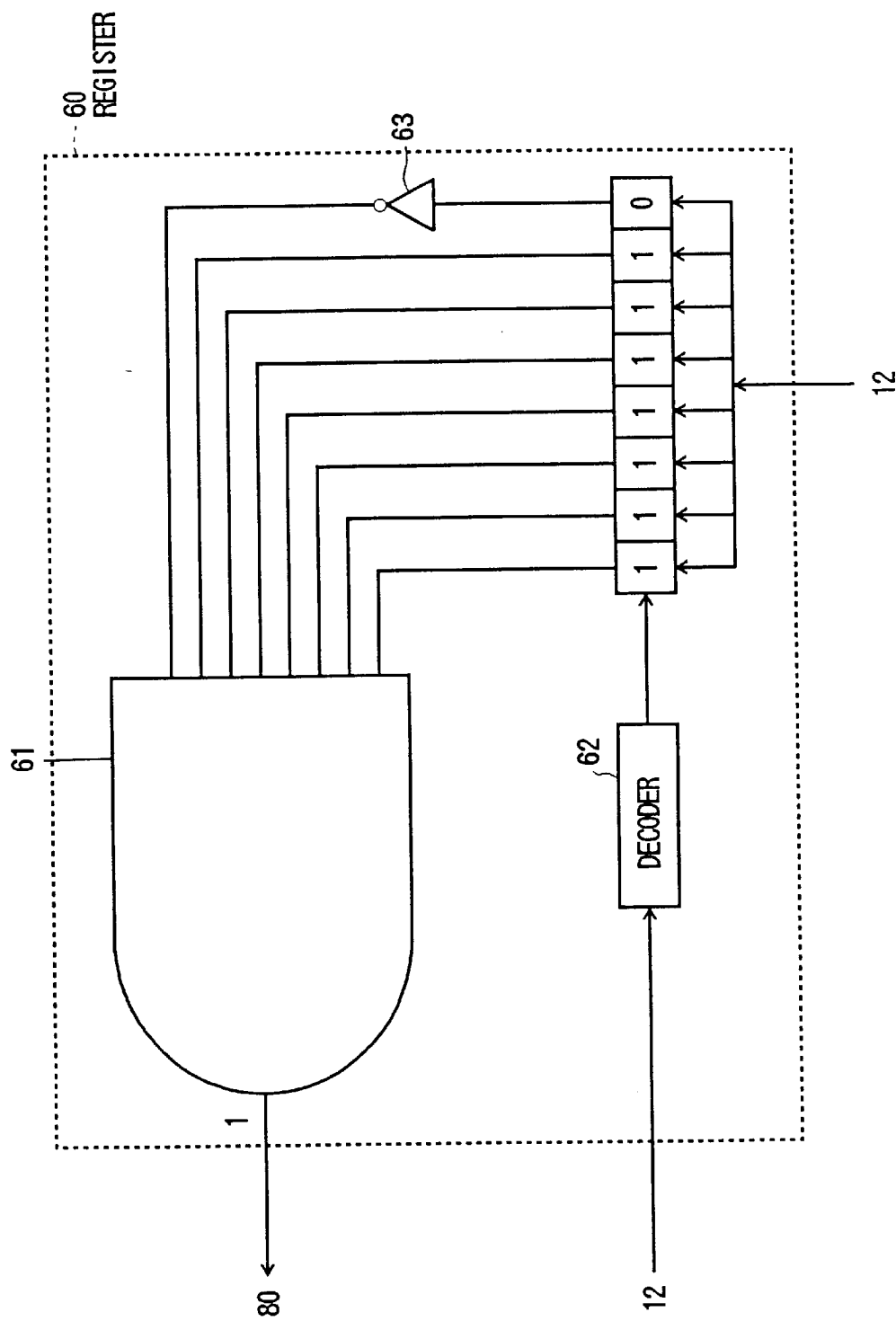
FIG. 2 illustrates an example of the structure of a register.

FIG. 2 illustrates an example of the structure of the register 60. As shown in this figure, the register 60 comprises an AND circuit 61, a decoder 62, and an inverter 63. When a high-level signal 1 is inputted into each of the input terminals of the AND circuit 61 from an internal bus 12 via the decoder 62, the register 60 outputs a high level signal 15 to the ROM read control circuit 80.

The mode switch circuit 70 supplies the EPROM/ICE interface circuit 50 and the ROM read control circuit 80 with mode signals based on signals inputted into terminals 71 and 72, thereby determining the operation mode of the semiconductor device 100.

Figure 3:
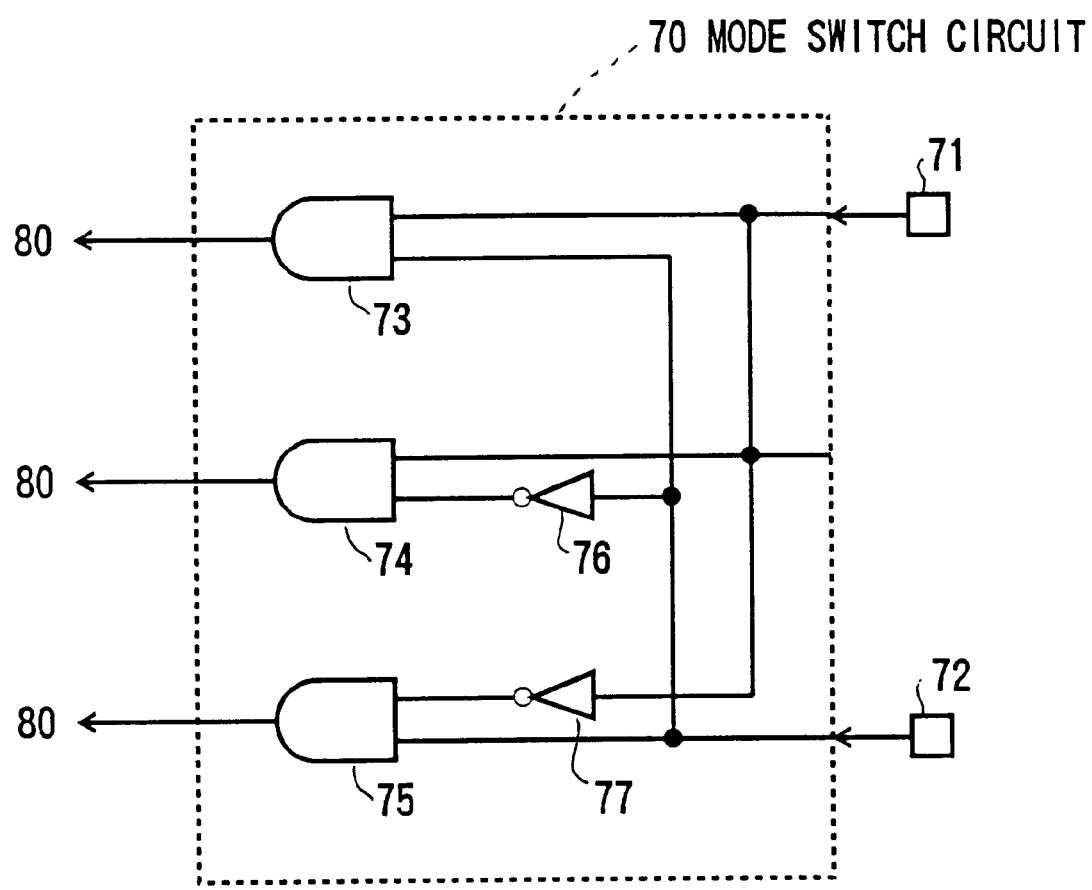
FIG. 3 illustrates an example of the structure of a mode switch circuit.

FIG. 3 illustrates an example of the structure of the mode switch circuit 70. As shown in FIG. 3, the mode switch circuit 70 comprises AND circuits 73 to 75, and inverters 76 and 77. The terminals 71 and 72 of the mode switch circuit 70 receive combinations of mode setting signals shown in FIG. 4.

FIG. 4 shows the relationship between the signals inputted into the mode switch circuit 70 and the signals outputted from the mode switch circuit 70. If low-level signals 0 are inputted into the terminals 71 and 72, for instance, the AND circuits 73 to 75 output low-level signals 0. The output signals are then sent to the CPU 20, the EPROM/ICE interface circuit 50, and the ROM read control circuit 80, thereby making the semiconductor device 100 disabled.

If a low-level signal 0 is inputted into the terminal 71 and a high-level signal 1 is inputted into the terminal 72, the AND circuits 73 and 74 output low-level signals, and the AND circuit 75 outputs a high-level signal 1. The output signals are then sent to the CPU 20, the EPROM/ICE interface circuit 50, and the ROM read control circuit 80, thereby putting the semiconductor device 100 in a ROM mode in which the semiconductor device 100 operates according to the data contained in the ROM 30 (hereinafter referred to as "In-ROM mode"). In the In-ROM mode, the data can be read from the ROM 30, regardless of the data value given to the register 60 from the internal bus 12.

If a high level signal 1 is inputted into the terminal 71 and a low-level signal 0 is inputted into the terminal 72, the semiconductor device 100 is put in the ICE mode. If high-level signals 1 are inputted into both terminals 71 and 72, the semiconductor device 100 is put in the EPROM mode.

The ROM read control circuit 80 outputs high-level and low-level signals in accordance with signals sent from the register 60 and the mode switch circuit 70. The output signal 14 from the ROM read control circuit 80 is sent to the ROM 30. If the output signal 14 is at high level, data can be read from the ROM 30. If the output signal 14 is at low level, data cannot be read from the ROM 30.

Figure 5:
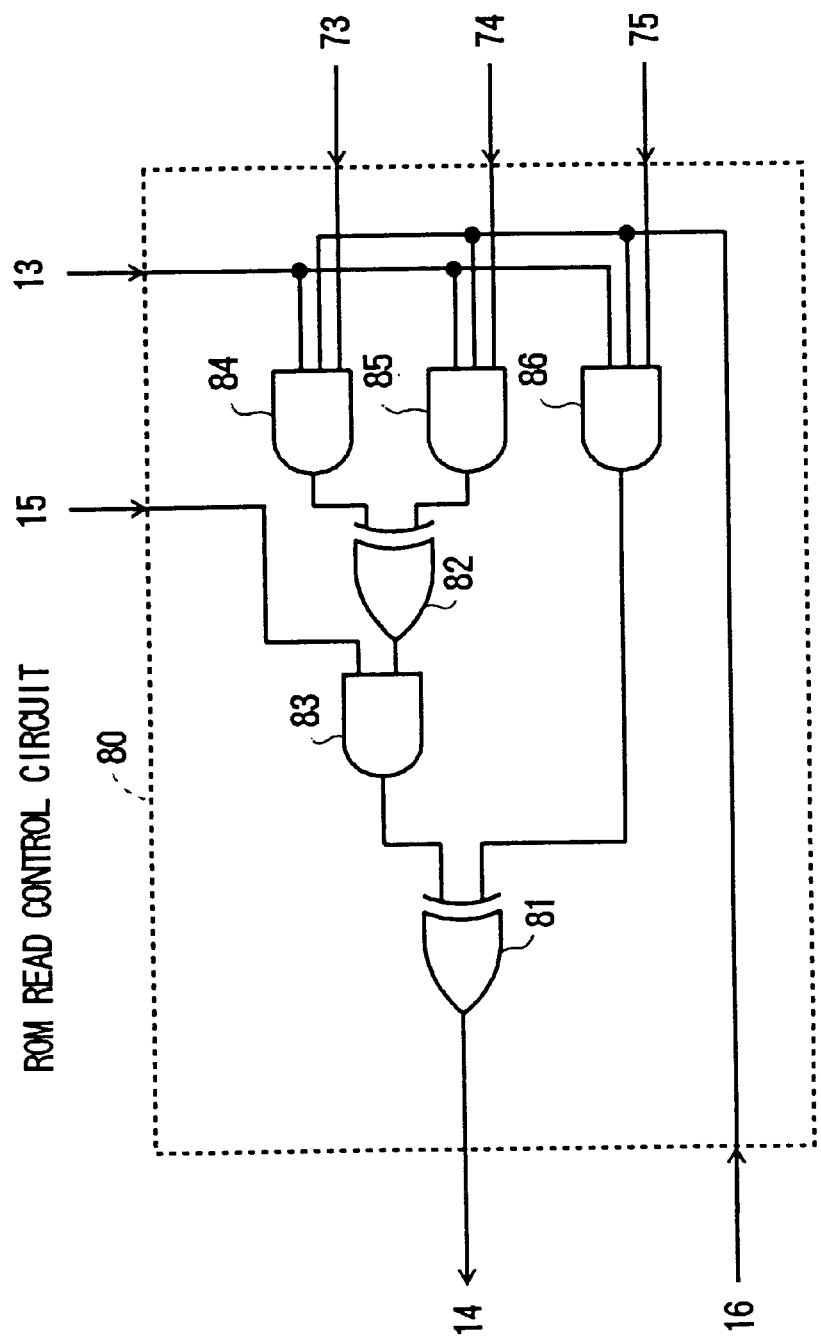
FIG. 5 shows an example of the structure of a ROM read control circuit.

FIG. 5 illustrates an example of the structure of the ROM read control circuit 80. As shown in FIG. 5, the ROM read control circuit 80 comprises EX(Exclusive)-OR circuits 81 and 82, AND circuits 84 to 86. The output signals from the AND circuits 73 to 75 in the mode switch circuits 70 are inputted into the AND circuits 84 to 86 in the ROM read control circuit 80, respectively. The AND circuits 84 to 86 also receive a signal 13 from the CPU 20 and a signal 16 from the decoder 40. The signal 15 from the register 60, which determines whether the data can be read from the ROM 30 in the EPROM/ICE mode, is inputted into the AND circuit 83 in the ROM read control circuit 80.

It should be understood that the structures of the register 60, the mode switch circuit 70, and the ROM read control circuit 80, are not limited to those shown in FIGS. 2, 3, and 5, but the structures may be modified if necessary.

Next, the operation of the semiconductor device 100 will be described.

Figure 6:
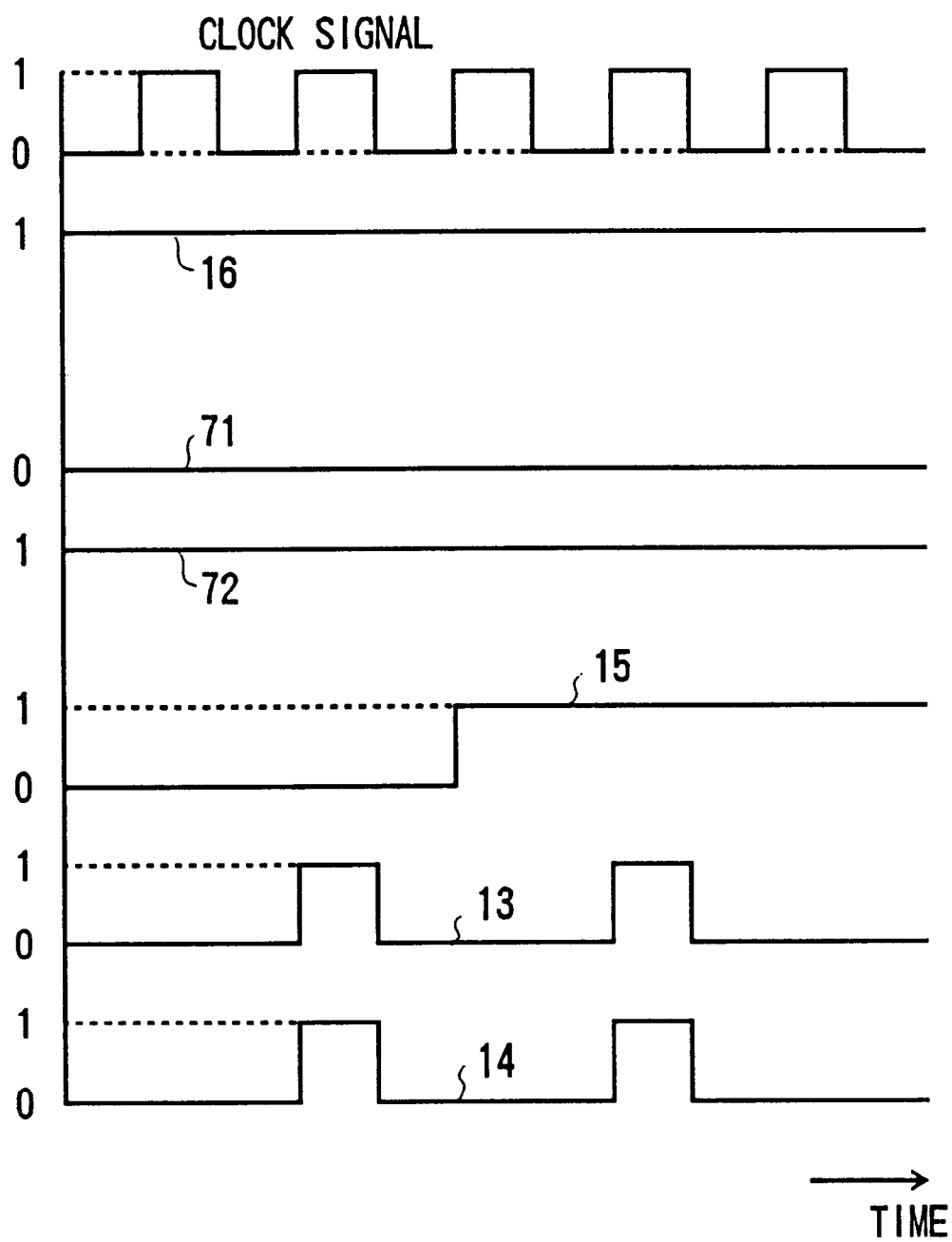
FIG. 6 is a timing chart showing waveforms of signals in an In-ROM mode.

FIG. 6 is a timing chart showing the waveforms of signals in the In-ROM mode. In the In-ROM mode, a low-level signal 0 and a high-level signal 1 are inputted into the terminal 71 and 72, and the mode switch circuit 70 then transmits low level signals 0 to the AND circuits 84 and 85, and a high-level signal 1 to the AND circuit 86 in the ROM read control circuit 80. Here, the decoder 40 transmits high-level signals 16 to the AND circuits 84, 85, and 86. Accordingly, the EX-OR circuit 81 outputs a low-level signal 14 when the signals 13 transmitted from the CPU 20 to the AND circuits 84 to 86 are at low level, regardless of the level of the signals 15 transmitted from the register 60 to the ROM read control circuit 80. When the signals 13 transmitted from the CPU 20 to the AND circuits 84 to 86 are at high level, the EX-OR circuit 81 outputs a high-level signal 14. As the ROM 30 receives the high-level signal 14, it becomes possible to read data from the ROM 30.

Figure 7:
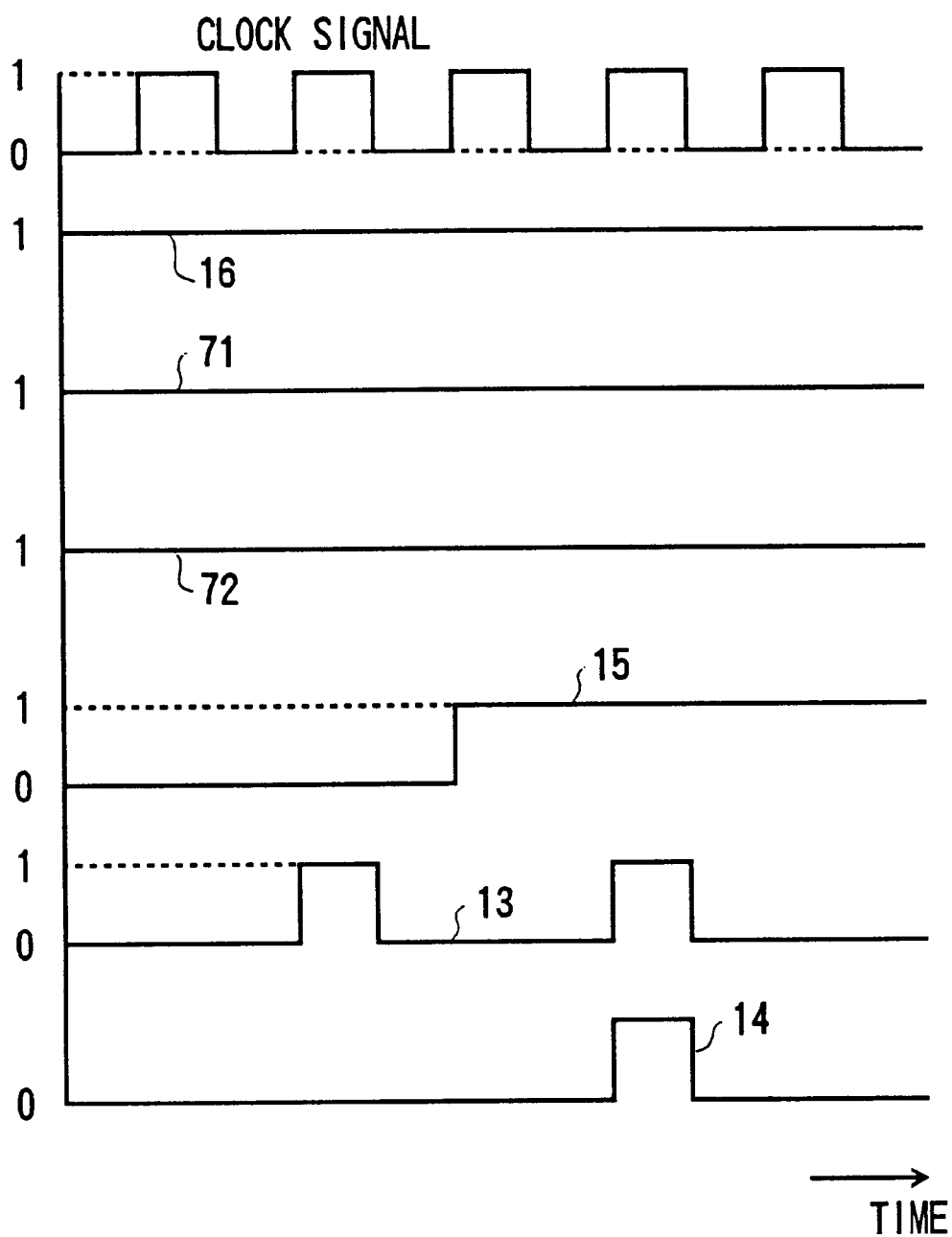
FIG. 7 is a timing chart showing waveforms of signals in an EPROM mode.

FIG. 7 is a timing chart showing the waveforms of signals in the EPROM mode. In the EPROM mode, high-level signals 1 are inputted into the terminals 71 and 72, and the mode switch circuit 70 then transmits a high-level signal 1 to the AND circuit 84, and low-level signals 0 to the AND circuits 85 and 86 in the ROM read control circuit 80. Here, the decoder 40 transmits high-level signals 16 to the AND circuits 84 to 86. Accordingly, no specific data value is inputted into the register 60 via the internal bus 12. When the register 60 transmits a low-level signal 15 to the ROM read control circuit 80, the EX-OR circuit 81 continues to output a low-level signal 14 even if the signal 13 inputted from the CPU20 into the ROM read control circuit 80 changes to a high-level signal. At this point, data cannot be read from the ROM 30.

On the other hand, when a specific data value is inputted into the register 60 via the internal bus 12 and the register 60 transmits a high-level signal 15 to the ROM read control circuit 80, the EX-OR circuit 81 also transmits a high-level signal 14 if the signal 13 inputted from the CPU 20 to the ROM read control circuit 80 changes to a high-level signal. At this point, it becomes possible to read data from the ROM 30.

In the ICE mode, as in the EPROM mode, the EX-OR circuit 81 outputs a high-level signal 14 when the signals 13, 15, and 16 are all at high level, thereby enabling data reading from the ROM 30.

Since the data cannot be read from the ROM 30 when no specific data value is inputted into the register 60 in the EPROM/ICE mode, it is possible to prevent the ROM data reading against the owner's will. The semiconductor device 100 has the In-ROM mode and the EPROM/ICE mode, so that there is no need to develop two semiconductor devices corresponding to both mode. Thus, the semiconductor device 100 can be produced in a shorter period of time, and the production costs of the semiconductor device 100 can also be reduced.

In the above embodiment, the data to be inputted into the AND circuit 61 shown in FIG. 2 correspond to the predetermined condition and the data in the claims of the present invention. Also, the signals inputted via the terminals 71 and 72 correspond to the mode selecting signals in the claims. The signals 14 and 15 correspond to a first signal and a second signal in the claims of the present invention.

The present invention is not limited to the specifically disclosed embodiments, but variations and modifications may be made without departing from the scope of the present invention.

The present application is based on Japanese priority application No. 10-239016, filed on Aug. 25, 1998, the entire contents of which are hereby incorporated by reference.

What is claimed is:

1. A semiconductor device having a test mode and a read mode, said semiconductor device comprising:
   a ROM;
   a control circuit which outputs data stored in the ROM to an outside of the semiconductor device in the test mode only when a predetermined condition is satisfied; and
   a read control circuit which controls a read operation of the ROM,
   wherein said control circuit comprises a circuit which enables the read control circuit in the test mode only when the predetermined condition is satisfied.

2. The semiconductor device as claimed in claim 1, wherein said control circuit comprises a circuit which reads data stored in the ROM in the test mode only when the predetermined condition is satisfied.

3. A semiconductor device having a test mode and a read mode, said semiconductor device comprising:
   a ROM;
   a control circuit which outputs data stored in the ROM to an outside of the semiconductor device in the test mode only when a predetermined condition is satisfied; and
   a register which stores data which controls a read operation of the ROM,
   wherein said control circuit comprises a circuit which enables a read control circuit in the test mode only when the data stored in the register indicates the predetermined condition.

4. A semiconductor device comprising:
   a mode switch circuit which selects between a test mode and a ROM mode in accordance with external mode select signals;
   a ROM read control circuit which outputs a first signal to enable ROM data reading; and
   a register which outputs a second signal to the ROM read control circuit in the test mode when predetermined data is inputted to the semiconductor device so that the ROM read control circuit outputs the first signal.

5. The semiconductor device as claimed in claim 4, wherein, in the test mode, the ROM data reading is enabled only when a predetermined condition is satisfied.

6. The semiconductor device as claimed in claim 5, wherein the predetermined condition is that predetermined data is inputted to the semiconductor device.

7. The semiconductor device as claimed in claim 6, wherein the ROM read control circuit outputs the first signal to enable the ROM data reading when the predetermined data is inputted to the semiconductor device in the test mode.

8. The semiconductor device as claimed in claim 7, wherein the register transmits the second signal to the ROM read control circuit when the predetermined data is inputted to the semiconductor device.

9. A semiconductor device having a test mode and a read mode, said semiconductor device comprising:
   a ROM;
   a control circuit which outputs data stored in the ROM to an outside of the semiconductor device in the test mode only when a predetermined condition is satisfied; and
   a ROM read control circuit which outputs a first signal which enables reading of data from the ROM when predetermined data is inputted to the semiconductor device in the test mode.

10. The semiconductor device as claimed in claim 9, further comprising:
    a register which outputs a second signal to the ROM read control circuit when the predetermined data is inputted to the semiconductor device so that the ROM read control circuit outputs the first signal.

11. A semiconductor device having first mode and a second mode which is different from the first mode, comprising:
    a ROM;
    a control circuit which outputs data stored in the ROM outside the semiconductor device in the first mode only when a predetermined condition is satisfied; and
    a ROM read control circuit which outputs a first signal which enables reading of data from the ROM when the predetermined data is inputted to the semiconductor device in the first mode.

12. The semiconductor device as claimed in claim 11, wherein the predetermined condition is satisfied when predetermined data is inputted to the semiconductor device.

13. The semiconductor device as claimed in claim 11, further comprising:
    a register which outputs a second signal to the ROM read control circuit when the predetermined data is inputted to the semiconductor device so that the ROM read control circuit outputs the first signal.

14. A semiconductor device having a test mode and a read mode, comprising:
    a ROM; and
    a ROM read control circuit outputting a signal which disables reading of data from the ROM in the test mode, and outputting a signal which enables reading of data from the ROM when a predetermined condition is satisfied in the test mode.

15. The semiconductor device as claimed in claim 14, further comprising:
    a mode switch circuit selecting the test mode or a ROM mode depending on external mode select signals; and
    a register outputting a predetermined signal to the ROM read control circuit so that the ROM read control circuit outputs the signal which enables reading of the data from the ROM.

16. The semiconductor device as claimed in claim 15, wherein the reading of the data from the ROM in the test mode is enabled only when the predetermined condition is satisfied.

17. The semiconductor device as claimed in claim 16, wherein the predetermined condition is satisfied when predetermined data is inputted to the semiconductor device.

18. The semiconductor device as claimed in claim 17, wherein the ROM read control circuit outputs the signal which enables the reading of the data from the ROM when the predetermined data is inputted in the test mode.

19. The semiconductor device as claimed in claim 18, wherein the register supplies the predetermined signal to the ROM read control circuit when the predetermined data is inputted to the semiconductor device.

* * * * *